(12) United States Patent
Kang

(10) Patent No.: US 8,164,155 B2
(45) Date of Patent: Apr. 24, 2012

(54) SEMICONDUCTOR DEVICE AND METHOD OF MANUFACTURING THE SAME

(75) Inventor: Myung-Il Kang, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 420 days.

(21) Appl. No.: 12/536,383

(22) Filed: Aug. 5, 2009

(65) Prior Publication Data

US 2010/0032792 A1    Feb. 11, 2010

(30) Foreign Application Priority Data

Aug. 8, 2008  (KR) .................. 10-2008-0077947

(51) Int. Cl.
 *H01L 29/06* (2006.01)
 *H01L 21/762* (2006.01)
 *H01L 23/48* (2006.01)
(52) U.S. Cl. . 257/499; 257/510; 257/741; 257/E21.546; 257/E23.01; 257/E29.02; 438/382; 438/424
(58) Field of Classification Search .................. 438/382, 438/424; 257/499, 741, E21.546, E23.01, 257/E29.02, 510, E29.12
See application file for complete search history.

(56) References Cited

U.S. PATENT DOCUMENTS 6,232,161 B1 * 5/2001 Chen et al. .................... 438/199
6,303,432 B1 * 10/2001 Horita et al. .................. 438/253

OTHER PUBLICATIONS

Stanley Wolf, Silicon Processing for the VSLI ERA, vol. 2, Lattice Press 1990, p. 48.*

* cited by examiner

*Primary Examiner* — David S Blum
(74) *Attorney, Agent, or Firm* — Sherr & Vaughn, PLLC

(57) ABSTRACT

A method for manufacturing a semiconductor device includes forming an N-well and a P-well formed in a semiconductor substrate. An isolation layer may be formed in the semiconductor substrate. At least one dummy active pattern may be formed in a boundary area between the N-well and the P-well. A salicide blocking layer may be over the upper surface of the at least one dummy active pattern. A non-salicide region may be formed over the upper surface of the at least one dummy active pattern by carrying out a salicide process over the semiconductor substrate provided with the salicide blocking layer.

22 Claims, 4 Drawing Sheets

SEMICONDUCTOR DEVICE AND METHOD OF MANUFACTURING THE SAME

The present application claims priority under 35 U.S.C. 119 to Korean Patent Application No. 10-2008-0077947 (filed on Aug. 8, 2008), which is hereby incorporated by reference in its entirety.

BACKGROUND

In semiconductor device manufacturing technology, when a design rule is decreased, pattern density increases, and formation of a precise pattern becomes an issue. Since it is difficult to achieve precise patterning in a fine process with a small design rule, and particularly, patterning in an active process, a delicate pattern is obtained through artificial pattern handling, such as optical proximity correction (OPC).

For purposes set out below, a technique of inserting a dummy pattern between main patterns is used. First, this technique is used to prevent the sizes of the main patterns from varying, according to their density, in a photolithography process or an etching process, and to achieve a fine pattern. Further, this technique is used to prevent variations in planarization according to the densities of the main patterns in a subsequent planarization process.

In cases where a dummy pattern is inserted into a boundary area between wells formed in a semiconductor substrate, a salicide may be formed over the upper surface of the dummy pattern by a salicide process. The formed salicide may generate leakage current. Since leakage current greatly influences characteristics of a semiconductor device, the dummy pattern cannot be formed over the upper surface of the boundary area between the wells.

FIG. 1 is a plan view illustrating a related semiconductor device, and FIG. 2 is a longitudinal-sectional view taken along the line C-C' of the semiconductor device of FIG. 1.

With reference to FIGS. 1 and 2, the semiconductor device includes a semiconductor substrate 1, an N-well 10 formed in one region of the semiconductor substrate 1, a P-well 20 formed in another region of the semiconductor substrate 1, an isolation region 30, active regions 32 and 34, electrodes 40a and 40b, and contacts 50a and 50b. The contacts 50a and 50b are formed in the active regions 32 and 34. The electrodes 40a and 40b are formed over the upper surfaces of the contacts 50a and 50b, and the contacts 50a and 50b are electrically connected to the electrodes 40a and 40b.

In cases where exposure and etching processes are carried out without a dummy pattern formed in a boundary area A between the wells 10 and 20, the size of the first active region 32 and the size of the second active region 34 may not be equal. Further, in cases where a planarization process is carried out without a dummy pattern formed in the boundary area A, a difference in the degree of planarization may be generated and thus dishing may occur.

FIG. 3 illustrates a leakage current generated when a dummy active pattern 50 is inserted into a boundary area (the portion "A") between the wells 10 and 20, shown in FIG. 2. With reference to FIG. 3, in a case where the dummy active pattern 50 is formed in the boundary area A, a salicide 60 may be formed over the upper surface of the dummy active pattern 50 through a salicide process, which will be carried out later.

To operate the semiconductor device, voltage Vdd of a first power supply is supplied to the N-well 10 through the first electrode 40a and the first contact 50a, and voltage Vss of a second power supply is supplied to the P-well 20 through the second electrode 40b and the second contact 50b.

A current path 70, as shown in FIG. 3, is formed between the first power supply and the second power supply by the salicide 60 formed over the upper surface of the dummy active pattern 50, and thus a leakage current may be generated.

Due to the leakage current generated when the dummy active pattern is formed over the upper surface of the boundary area A between the wells 10 and 20, the technique of inserting a dummy pattern between main patterns is not used in the boundary area A.

SUMMARY

Embodiments relate to a semiconductor device and a method of manufacturing the same, and more particularly, to a semiconductor device, in which a non-salicide dummy active pattern is formed in boundary area between well regions, and a method of manufacturing the semiconductor device. Embodiments relate to a semiconductor device which prevents generation of a leakage current although a dummy active pattern is formed in a boundary area between well regions, and a method of manufacturing the semiconductor device.

Embodiments relate to a semiconductor device which includes an N-well and a P-well formed in a semiconductor substrate, an isolation layer formed in the semiconductor substrate to define active regions and field regions, at least one dummy active pattern formed in a boundary area between the N-well and the P-well, and a non-salicide region formed over the at least one dummy active pattern.

Embodiments relate to a method of manufacturing a semiconductor device which includes forming an N-well and a P-well in a semiconductor substrate, forming an isolation layer in the semiconductor substrate provided with the N-well and the P-well, forming at least one dummy active pattern in a boundary area between the N-well and the P-well, forming a salicide blocking layer over the upper surface of the at least one dummy active pattern, and forming a non-salicide region over the upper surface of the at least one dummy active pattern by carrying out a salicide process over the semiconductor substrate provided with the salicide blocking layer.

DRAWINGS

Figure 1:
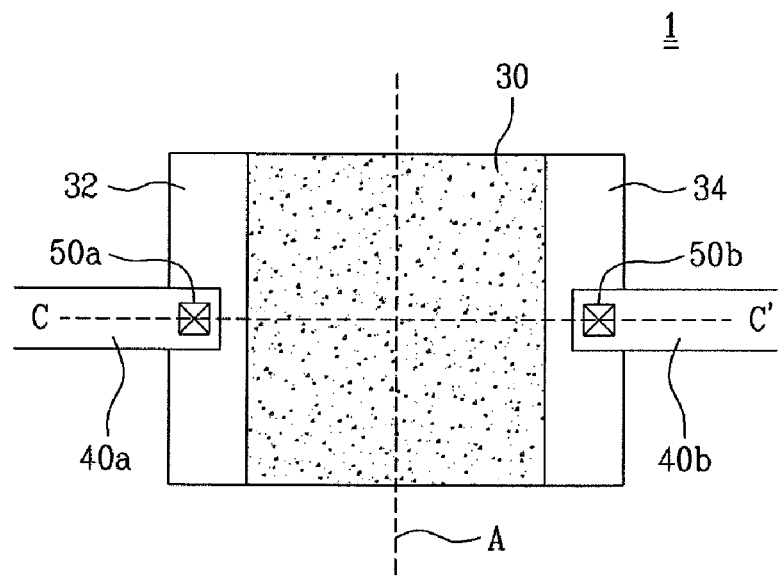
FIG. 1 is a plan view illustrating a related semiconductor device.
Figure 2:
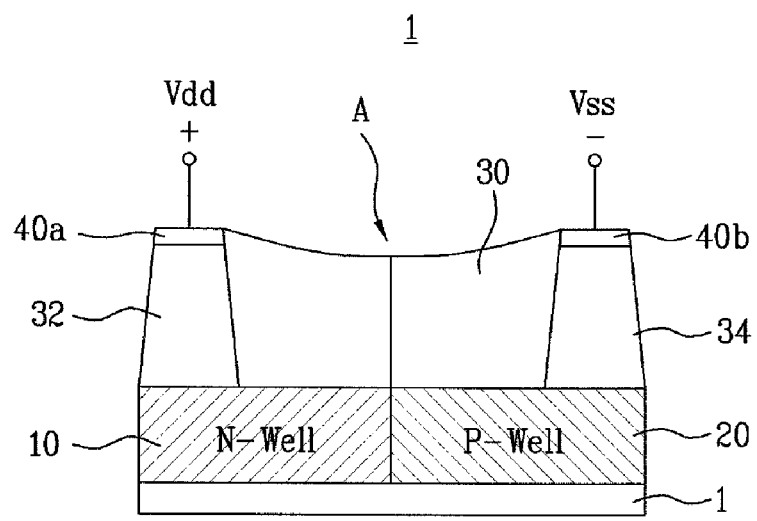
FIG. 2 is a longitudinal-sectional view taken along the line C-C' of the semiconductor device of FIG. 1.
Figure 3:
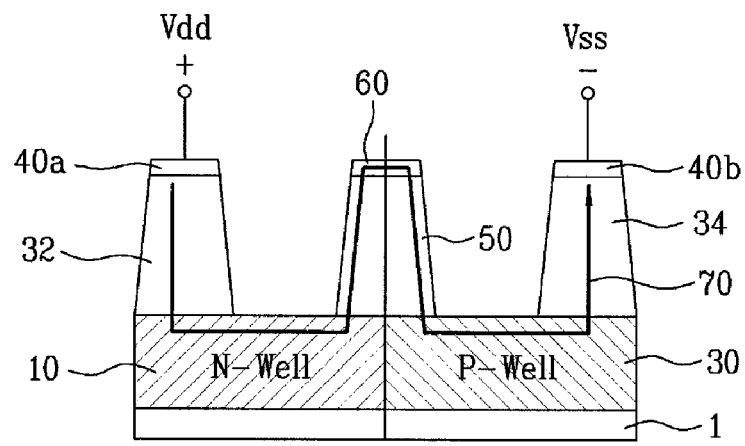
FIG. 3 is a longitudinal sectional view illustrating a leakage current generated when a dummy active pattern is inserted into a boundary (the portion "A") between wells shown in FIG. 2.
Figure 4:
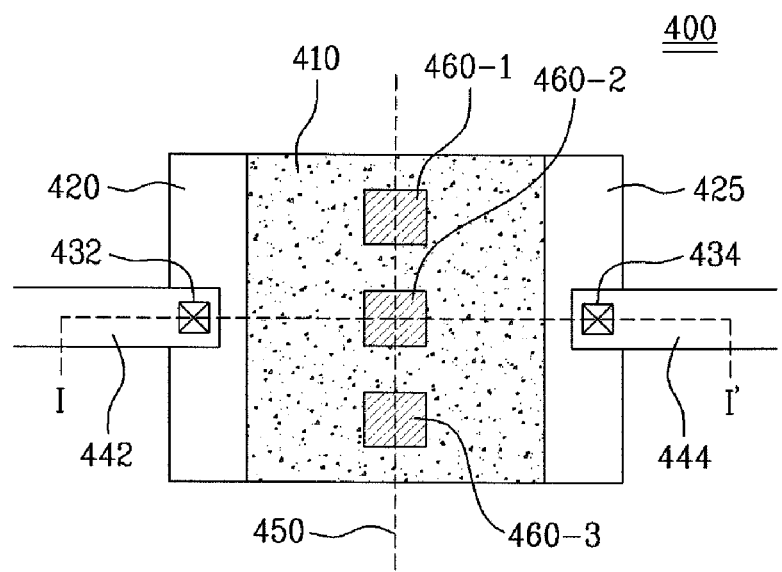

Example FIG. 4 is a plan view illustrating a semiconductor device in accordance with embodiments.

Figure 5A:
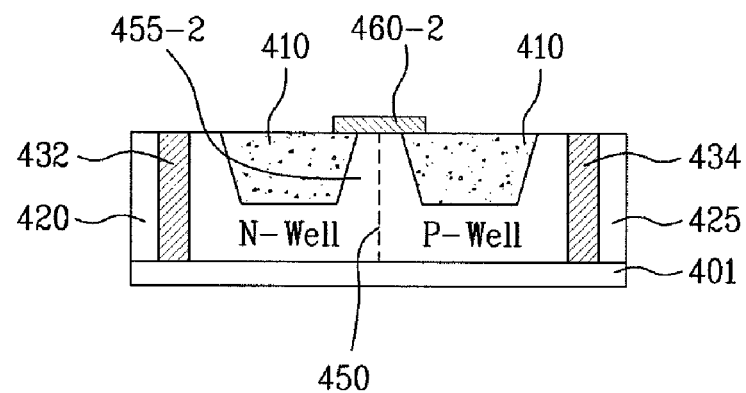
Figure 5B:
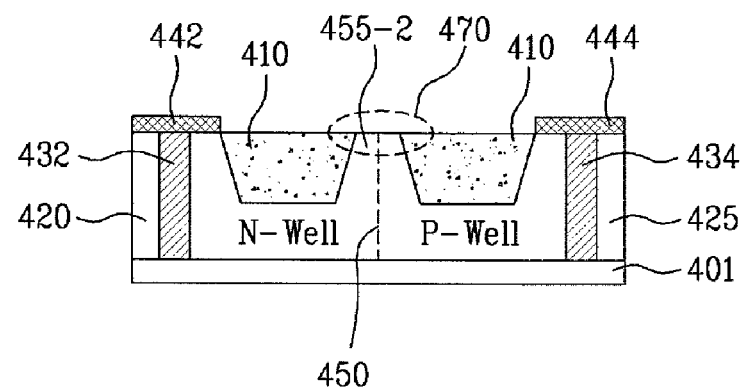

Example FIGS. 5a and 5b are longitudinal-sectional views taken along the line I-I' of the semiconductor device of example FIG. 4, illustrating a method of manufacturing the semiconductor device.

Figure 6A:
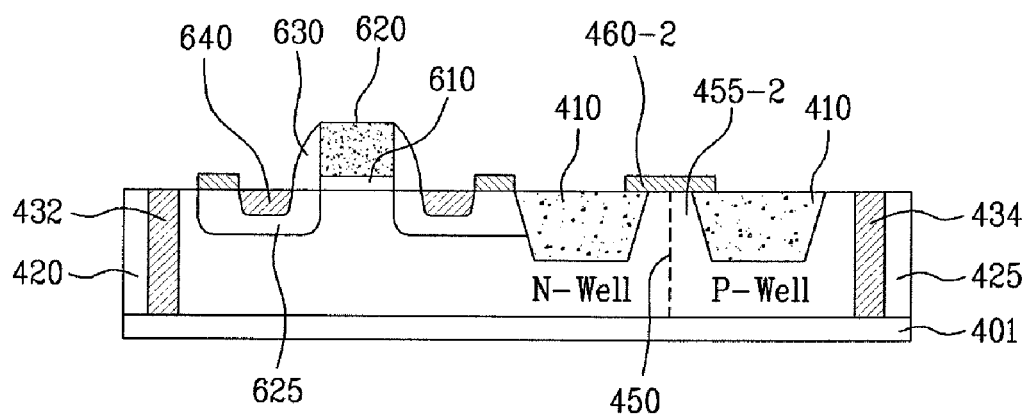
Figure 6B:
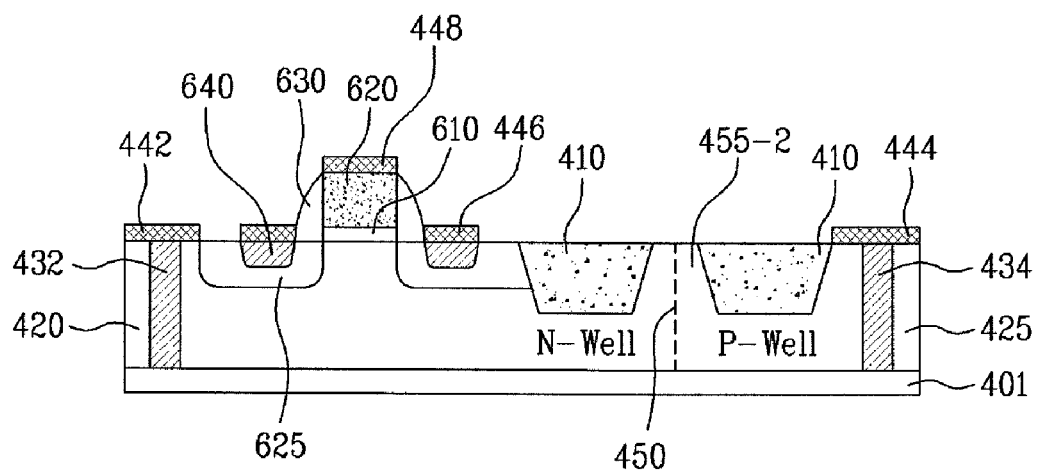

Example FIGS. 6a and 6b are longitudinal-sectional views illustrating a method of manufacturing a semiconductor device in accordance with embodiments.

DESCRIPTION

Example FIG. 4 is a plan view illustrating a semiconductor device in accordance with embodiments, and example FIGS. 5a and 5b are longitudinal-sectional views taken along the line I-I' of the semiconductor device of example FIG. 4, illustrating a method of manufacturing the semiconductor device.

With reference to example FIG. 4 and example FIGS. 5a and 5b, a semiconductor device may include an N-well and a P-well formed in a semiconductor substrate 401, an isolation layer 410, at least one dummy active pattern 455-2, contacts 432 and 434, and electrodes 442 and 444. First, the N-well and the P-well may be formed by implanting impurity ions into the semiconductor substrate 401. For example, in the case of a PMOS device, the N-well is formed, and in the case of an NMOS device, the P-well is formed.

The isolation layer 410 may be formed in the semiconductor substrate 401, in which the N-well and the P-well are formed, by carrying out a shallow trench isolation (STI) process, and defining active regions 420 and 425 and field regions over the semiconductor substrate 401. Here, elements, such as a logic PMOS region, a logic NMOS region, a logic memory region, or the electrodes 442 and 444, to which power is supplied, may be formed in the active regions 420 and 425.

The at least one dummy active pattern 455-2 may be formed in one region of the semiconductor substrate 401 adjacent to a boundary 450 between the N-well and the P-well. Although example FIG. 4 illustrates three dummy active patterns 455-2, the number of the dummy active patterns 455-2 in accordance with embodiments is not limited thereto. Example FIG. 5a illustrates only one of the three dummy active patterns 455-2.

The contacts 432 and 434 may be formed by implanting impurity ions having the same conductivity type as those of the wells in which the contacts 432 and 434 are formed. The electrodes 442 and 444 may be formed over the upper surfaces of the contacts 432 and 434 through a salicide process.

A non-salicide region 470 may be formed over the upper surface of the at least one dummy active pattern 455-2 through a non-salicide process. That is, a salicide blocking layer may be formed over the upper surface of the at least one dummy active pattern 455-2 through the non-salicide process. Therefore, although the salicide process will be carried out later, no salicide will be formed on the upper surface of the at least one dummy active pattern 455-2 due to the salicide blocking layer.

With reference to example FIGS. 5a and 5b, a method of manufacturing a semiconductor device including the dummy active pattern 455-2 will be described. First, as shown in example FIG. 5a, the N-well and P-well may be formed by implanting impurity ions into the semiconductor substrate 401. Thereafter, the isolation layer 410 may be formed in the semiconductor substrate 401, in which the N-well and the P-well are formed. The isolation layer 410 may be formed by the STI process.

A trench pattern for forming the isolation layer 410 may be formed by an exposure process using photolithography and an etching process. For example, to form trenches for the isolation layer 410, a first photoresist pattern may be formed. The semiconductor substrate 401 may be etched using the first photoresist pattern as an etching mask, thereby forming the trenches.

Here, the first photoresist pattern may be formed such that the at least one dummy active pattern 455-2 is formed in one region of the semiconductor substrate 401 adjacent to the boundary 450 between the N-well and the P-well. For example, the first photoresist pattern may be formed so that it does not expose the region of the semiconductor substrate 401 adjacent to the boundary 450 in which the at least one dummy active pattern 455-2 will be formed.

The trenches may be formed by etching the semiconductor substrate (for example, a silicon substrate) 401 using the first photoresist pattern as the etching mask. Here, the region of the semiconductor substrate 401 adjacent to the boundary 450, in which the at least one dummy active pattern 455-2 will be formed, is not etched. Thereafter, the trenches are filled with an insulating material (for example, an oxide), and the first photoresist pattern may be removed, thereby forming the isolation layer 410 and the at least one dummy active pattern 455-2 in the region of the semiconductor substrate 401 adjacent to the boundary 450.

As described above, the at least one dummy active pattern 455-2 may be patterned using the first photoresist pattern for formation of the isolation layer 410. That is, the first photoresist layer may be patterned such that the at least one dummy active pattern 455-2 is formed in the region of the semiconductor substrate 401 adjacent to the boundary 450 between the N-well and the P-well. Here, the isolation layer 410 may be made of an oxide, and the at least one dummy active pattern 455-2 may be made of silicon (Si).

The at least one dummy active pattern 455-2 may have no height difference with the semiconductor substrate 401 in the active regions 420 and 425. That is, the at least one dummy active pattern 455-2 has the same height as that of the semiconductor substrate 401 in the active regions 420 and 425.

The contacts 432 and 434 may be formed by implanting impurity ions, for example, impurity ions having the same conductivity types as those of the wells, in which the contacts 432 and 434 are formed, into the active regions 420 and 425. For example, to form the contact 432 formed in the N-well, N-type impurity ions are implanted.

Thereafter, the non-salicide process over the upper surface of the at least one dummy active pattern 455-2 may be carried out. The non-salicide process refers to a process, which prevents formation of a salicide over the upper surface of the at least one dummy active pattern 455-2 during the salicide process of the semiconductor device, which will be carried out later.

For example, an insulating film (for example, an oxide film) may be formed over the semiconductor substrate 401 provided with the at least one dummy active pattern 455-2. The oxide film may be patterned through a photolithography process and an etching process, thus forming oxide film patterns 460-1, 460-2, and 460-3 covering the upper surface of the at least one dummy active pattern 455-2. For example, the oxide film patterns 460-1, 460-2, and 460-3 may be made of tetra-ethyl-ortho-silicate (TEOS).

Thereafter, the salicide process may be carried out. During the salicide process, a metal, such as cobalt or nickel, may be deposited over the semiconductor substrate 401 including the oxide film patterns 460-1, 460-2, and 460-3. Annealing may then be carried out at a high temperature. During annealing, the metal reacts with silicon (for example, the active regions of the semiconductor substrate), thus forming a salicide. However, no salicide reaction is generated over the upper surface of the at least one dummy active pattern 455-2 due to the oxide film patterns 460-1, 460-2, and 460-3.

Here, the oxide film patterns 460-1, 460-2, and 460-3 serve as a salicide blocking layer. As described above, the oxide film patterns 460-1, 460-2, and 460-3 serve to block formation of the salicide over the upper surface of the at least one dummy active pattern 455-2 during the salicide process.

As shown in example FIG. 5b, the remaining metal, which does not cause the salicide reaction, and the oxide film patterns 460-1, 460-2, and 460-3, may be removed. Therefore, the salicide may be formed over the active regions 420 and 425, while not being formed over the upper surface of the at least one dummy active pattern 455-2. Thereby, the non-salicide region 470 may be formed over the upper surface of the at least one dummy active pattern 455-2.

Example FIGS. 6a and 6b are longitudinal-sectional views illustrating a method of manufacturing a semiconductor device in accordance with embodiments. With reference to example FIG. 6a, an N-well and a P-well may be formed in a semiconductor substrate 401. An isolation film 410 may be formed in the semiconductor substrate 401, as described above.

At least one dummy active pattern 455-2 may be formed together with the isolation film 410. That is, a photoresist pattern for formation of the isolation film 410 may be formed in consideration of the at least one dummy active pattern 455-2, as described above. The at least one dummy active pattern 455-2 may be formed in one region of the semiconductor substrate 401 adjacent to a boundary 450 between the N-well and the P-well.

A gate pattern including a gate oxide film 610 and a gate poly 620 may be formed in the active region (for example, 420) of the semiconductor substrate 401. LDD regions 625 may be formed at both sides of the gate pattern in the active region 420. Thereafter, spacers 630 may be formed at side walls of the gate pattern, and source/drain regions 640 may be formed in the LDD regions 625 at both sides of the spacers 630. Contacts 432 and 434 may be formed by implanting impurity ions into designated portions of the active regions 420 and 425. The contacts 432 and 434 may be formed together with the formation of the source/drain regions 640.

Thereafter, the non-salicide process may be carried out over the semiconductor substrate (hereinafter, referred to as a prepared semiconductor substrate) 401 including the isolation layer 410, the gate pattern, the spacers 630, the source/drain regions 640, and the contacts 432 and 434. Here, the non-salicide process may be carried out to form a non-salicide resistance or define a non-salicide region.

For example, to define the non-salicide region, an oxide film pattern 460-2 may be formed over the prepared semiconductor substrate 401. During the non-salicide process, the oxide film pattern 460-2 may be formed also over the at least one dummy active pattern 455-2.

Thereafter, the salicide process may be carried out. During the salicide process, a metal, such as cobalt or nickel, may be deposited over the semiconductor substrate 401 provided with the oxide film pattern 460-2. Annealing may then be carried out at a high temperature.

During annealing, the metal reacts with silicon, thus forming salicide. For example, salicides 442, 444, 446, and 448 may be formed over the upper surfaces of the source/drain regions 640, the gate pattern 610 and 620, and the contacts 432 and 434. However, no salicide is formed over the upper surface of the at least one dummy active pattern 455-2 by the oxide film pattern 460-2. For this reason, the oxide film pattern 460-2 may be referred to as a salicide blocking layer.

As shown in example FIG. 6b, the remaining metal, which does not cause the salicide reaction, and the oxide film pattern 460-2 may be removed. Therefore, the non-salicide region, in which no salicide is formed, may be formed over the at least one dummy active pattern 455-2.

As described above, in a semiconductor device and a method of manufacturing the same in accordance with embodiments, a non-salicide region may be formed over the upper surface of at least one dummy active pattern formed in one region of a semiconductor substrate adjacent to a boundary between an N-well and a P-well, thus preventing a leakage current from flowing between the wells even if power (Vdd and Vss) is supplied to the electrodes. The non-salicide region serves to block a current path, along which the leakage current would flow.

As apparent from the above description, in a semiconductor device and a method of manufacturing the same in accordance with embodiments, at least one dummy active pattern may be formed in a boundary area between wells, and no salicide is formed over the upper surface of the at least one dummy active pattern, thus preventing generation of a leakage current.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   an N-well and a P-well formed in a semiconductor substrate;
   an isolation layer formed in the semiconductor substrate to define active regions and field regions;
   at least one dummy active pattern formed in a boundary area between the N-well and the P-well, wherein each dummy active pattern is formed in both the N-well and the P-well; and
   a non-salicide region formed over the at least one dummy active pattern.

2. The apparatus of claim 1, further comprising salicide regions formed in the active regions of the semiconductor substrate.

3. The apparatus of claim 1, wherein the at least one dummy active pattern is made of silicon.

4. The apparatus of claim 2, further comprising contacts formed by implanting impurity ions into the active regions.

5. The apparatus of claim 4, wherein the salicide regions are formed over the upper surfaces of the contacts.

6. The apparatus of claim 1, wherein the at least one dummy active pattern is formed in one region of the semiconductor substrate adjacent to a boundary between the N-well and the P-well.

7. The apparatus of claim 1, wherein said each dummy active pattern is surrounded by and in direct contact with the isolation layer.

8. A method comprising:
   forming an N-well and a P-well in a semiconductor substrate;
   forming an isolation layer in the semiconductor substrate provided with the N-well and the P-well;
   forming at least one dummy active pattern in a boundary area between the N-well and the P-well, wherein each dummy active pattern is formed in both the N-well and the P-well;
   forming a salicide blocking layer over the upper surface of the at least one dummy active pattern; and
   forming a non-salicide region over the upper surface of the at least one dummy active pattern by carrying out a salicide process over the semiconductor substrate provided with the salicide blocking layer.

9. The method of claim 8, wherein the formation of the at least one dummy active pattern is carried out together with a patterning process to form the isolation layer.

10. The method of claim 9, wherein the formation of the isolation layer includes:
    forming a first photoresist pattern to form trenches to form the isolation layer;

forming the trenches by etching the semiconductor substrate using the first photoresist pattern; and forming the isolation layer by filling the insides of the trenches with an oxide and removing the first photoresist pattern.

11. The method of claim 10, wherein the formation of the first photoresist pattern is carried out so as not to expose one region of the semiconductor substrate adjacent to a boundary between the N-well and the P-well, in which the at least one dummy active pattern is formed.

12. The method of claim 8, wherein the formation of the salicide blocking layer includes:

forming an oxide layer over the semiconductor substrate provided with the at least one dummy active pattern; and forming the salicide blocking layer covering the upper surface of the at least one dummy active pattern by patterning the oxide film through a photography process and an etching process.

13. The method of claim 8, wherein the formation of the non-salicide region includes:

depositing a metal from the group consisting of nickel and cobalt over the semiconductor substrate provided with the salicide blocking layer; and forming the non-salicide region over the upper surface of the at least one dummy active pattern by preventing a salicide reaction between the metal and the at least one dummy active pattern by the salicide blocking layer during the salicide process.

14. The method of claim 13, wherein salicide regions are formed over the upper surfaces of the active regions of the semiconductor substrate during the salicide process.

15. The method of claim 8, wherein salicide process includes annealing.

16. The method of claim 8, wherein said each dummy active pattern is surrounded by and in direct contact with the isolation layer.

17. An apparatus comprising:

an N-well and a P-well formed in at least one active region of a semiconductor substrate;

at least one dummy active pattern formed in a boundary area between the N-well and the P-well, wherein each dummy active pattern is formed in both the N-well and the P-well; and a non-salicide region formed over the at least one dummy active pattern.

18. The apparatus of claim 17, further comprising salicide regions formed in the active region of the semiconductor substrate.

19. The apparatus of claim 17, wherein the at least one dummy active pattern is made of silicon.

20. The apparatus of claim 18, further comprising contacts formed by implanting impurity ions into the active region.

21. The apparatus of claim 20, wherein the salicide regions are formed over the upper surfaces of the contacts.

22. The apparatus of claim 17, wherein the at least one dummy active pattern is formed in one region of the semiconductor substrate adjacent to a boundary between the N-well and the P-well.

* * * * *